US012266745B2

(12) United States Patent
Yun

(10) Patent No.: US 12,266,745 B2
(45) Date of Patent: Apr. 1, 2025

(54) LIGHT SOURCE DEVICE AND CAMERA INSPECTION DEVICE USING SAME

(71) Applicant: LG INNOTEK CO., LTD., Seoul (KR)

(72) Inventor: Ji Hyun Yun, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/010,884

(22) PCT Filed: May 10, 2021

(86) PCT No.: PCT/KR2021/005806
§ 371 (c)(1),
(2) Date: Dec. 16, 2022

(87) PCT Pub. No.: WO2021/256705
PCT Pub. Date: Dec. 23, 2021

(65) Prior Publication Data
US 2023/0231088 A1 Jul. 20, 2023

(30) Foreign Application Priority Data
Jun. 17, 2020 (KR) .................. 10-2020-0073513

(51) Int. Cl.
*H01L 33/54* (2010.01)
*G11B 27/36* (2006.01)
(Continued)

(52) U.S. Cl.
CPC .............. *H01L 33/54* (2013.01); *G11B 27/36* (2013.01); *H01L 25/0753* (2013.01); *H01L 33/56* (2013.01); *H04N 17/002* (2013.01)

(58) Field of Classification Search
CPC ....... H04N 17/002; H01L 33/54; H01L 33/56; G11B 27/36
See application file for complete search history.

(56) References Cited

U.S. PATENT DOCUMENTS 9,719,672 B1 * 8/2017 Moghal ................ F21V 31/005
10,453,218 B2 * 10/2019 Doganis .................... G06T 7/80
(Continued)

FOREIGN PATENT DOCUMENTS

CN 210573939 U * 5/2020
JP 2014-146809 8/2014
(Continued)

OTHER PUBLICATIONS

International Search Report dated Aug. 26, 2021 issued in Application No. PCT/KR2021/005806.

*Primary Examiner* — Evan P Dzierzynski
*Assistant Examiner* — Nathaniel J Lee
(74) *Attorney, Agent, or Firm* — KED & ASSOCIATES, LLP

(57) ABSTRACT

The present invention relates to a light source device having minimized exposure of an LED package formed on the light source device, and a camera inspection device using same such that erroneous detections during camera inspection can be minimized A camera inspection device according to the present invention comprises: a portable terminal cradle on which a portable terminal equipped with a camera is cradled; a light source device installed to be spaced apart from the upper portion of the portable terminal cradle by a predetermined distance and configured to emit light towards the camera; and a controller for controlling the turning on/off of the light source device and imaging operations of the camera so as to perform a light bleeding inspection of the camera mounted on the portable terminal. A light source device according to the present invention comprises: an LED package having multiple LED elements mounted on the upper surface of a printed circuit board; and an LED package cover having multiple coupling holes into which the multiple LED elements mounted on the LED package are inserted, respectively, the LED package cover covering a (Continued)

part of the upper surface of the printed circuit board, which is exposed between the multiple LED elements. The LED package cover having a lusterless surface is used to insert the LED elements mounted on the LED package into the coupling holes and to cover same, thereby preventing light bleeding inspection erroneous detections caused by exposure of elements, wires, or soldering parts on side surfaces of the LED elements. The LED package cover has the same height as that of the LED elements of the LED package, thereby preventing the LED elements from being damaged by exposure to the outside.

17 Claims, 15 Drawing Sheets

(51) Int. Cl.
*H01L 25/075* (2006.01)
*H01L 33/56* (2010.01)
*H04N 17/00* (2006.01)

(56) References Cited

U.S. PATENT DOCUMENTS

| | | | |
|---|---|---|---|
| 2008/0075324 A1* | 3/2008 | Sato | G06T 7/80 |
| | | | 348/E13.005 |
| 2008/0277677 A1 | 11/2008 | Kuo et al. | |
| 2009/0296395 A1* | 12/2009 | Tarko | F21S 4/22 |
| | | | 257/E33.056 |
| 2010/0295070 A1* | 11/2010 | Su | H01L 25/0753 |
| | | | 257/E33.059 |
| 2014/0286009 A1* | 9/2014 | Hamilton | H05K 9/0054 |
| | | | 362/249.02 |

FOREIGN PATENT DOCUMENTS

| | | |
|---|---|---|
| KR | 10-2009-0127296 | 12/2009 |
| KR | 10-1640555 | 7/2016 |

* cited by examiner

1

1

LIGHT SOURCE DEVICE AND CAMERA INSPECTION DEVICE USING SAME

CROSS-REFERENCE TO RELATED PATENT APPLICATIONS

This application is a U.S. National Stage Application under 35 U.S.C. § 371 of PCT Application No. PCT/KR2021/005806, filed May 10, 2021, which claims priority to Korean Patent Application No. 10-2020-0073513, filed Jun. 17, 2020, whose entire disclosures are hereby incorporated by reference.

TECHNICAL FIELD

Embodiments relate to a light source device and a camera inspection device using the same, and more particularly, to a light source device which minimizes exposure of an LED package formed thereon, and a camera inspection device using the light source device which may minimize erroneous detection during camera inspection.

BACKGROUND ART

Recently, portable terminals, such as cellular phones, smart phones, Personal Digital Assistants (PDAs), tablet PCs, etc., not only function as telephones but also are being used to realize multi-convergence for music, movies, TVs, games, etc. along with advancements of technologies.

As one of devices configured to realize multi-convergence using such portable terminals, camera lens modules may be representative.

Here, a camera lens module industry is a value-added industry requiring advanced technologies, and the importance of camera lens modules installed in portable terminals is being emphasized due to a tendency towards the high specification and advancement of the portable terminals, such as smart phones.

A camera mounted in a portable terminal is manufactured using Charge Coupled Device (CCD) or Complementary Metal-Oxide Semiconductor (CMOS) image sensors as main parts, the camera may acquire the image of an object by condensing light through the image sensors and may store the image as data in a memory in the portable terminal, and the stored image data may be displayed as an image on a display of the portable terminal.

An inspection device configured to inspect a camera includes a light source device so as to inspect light bleeding of the camera, as shown in FIG. 1. The light source device 1 includes a plurality of LED elements disposed in an array on a printed circuit board. As a method of inspecting light bleeding of the camera using the light source device 1, the camera photographs light sources and the printed circuit board having a black background, and whether or not light bleeding occurs is inspected by analyzing a brightness difference between the images of the light sources and the background.

In a preferred process of inspecting light bleeding, it is ideal to allow only the light source, i.e., an object to be measured, to be seen, as shown in FIG. 2A. However, when the side surface or soldering part of the light source, i.e., the LED element, is observed in an inspection region, the LED element may be erroneously detected. For example, when a camera module, to which a wide angle lens having an angle of view of 120° or more is applied, is used, the side surfaces of the LED elements may be seen, as shown in FIG. 2B. Therefore, when the soldering part other than the light source is observed in the inspection region, as shown in FIG. 2C, erroneous detection occurs in an image inspection, and thus, an error in inspection determination may occur. Further, in the case in which an LED package is exposed to the outside, the LED package may be damaged due to carelessness in management.

DISCLOSURE

Technical Problem

Embodiments provide a light source device which may minimize exposure of an LED package, and a camera inspection device using the same.

Further, embodiments provide a light source device which may prevent an LED package from being damaged or contaminated, and a camera inspection device using the same.

Technical Solution

In one embodiment, a light source device incudes an LED package configured such that a plurality of LED elements is mounted on an upper surface of a printed circuit board, and an LED package cover configured to cover exposed parts of the upper surface of the printed circuit board between the plurality of LED elements, and including a plurality of coupling holes configured such that the plurality of LED elements mounted on the LED package is respectively inserted thereinto.

A depth of the coupling holes may be equal to a height of the LED elements from the upper surface of the printed circuit board to upper ends of the LED elements.

The LED package cover may be formed of a plastic-based material.

The plurality of LED elements may be coupled to the plurality of coupling holes in a fitting manner, and the LED package cover may be formed of an elastic material.

The LED package cover may further include a lower surface provided opposite to the upper surface of the printed circuit board, and an upper surface configured to be matte-finished and provided on an opposite side of the LED package cover to the lower surface thereof.

The lower surface of the LED package cover may be bonded to the upper surface of the printed circuit board.

The LED package cover may further include a plurality of screw coupling holes, and the LED package cover may be screw-connected to the printed circuit board through the plurality of screw coupling holes.

The plurality of screw coupling holes may be formed at respective corners of the LED package cover.

The LED package cover may be formed in a platy shape or a circular shape.

The LED package cover may cover soldering parts configured to bond the plurality of LED elements to the upper surface of the printed circuit board.

A heat sink formed of aluminum may be disposed on the lower surface of the printed circuit board of the LED package.

A circumference of a bonding part between the LED package and the LED package cover may be sealed with silicone.

In another embodiment, a camera inspection device includes a portable terminal cradle configured such that a portable terminal provided with a camera is held therein, the above-described light source device installed to be spaced apart from an upper portion of the portable terminal cradle by a predetermined distance and configured to radiate light towards the camera, and a controller configured to control turning-on of the light source device and an imaging operation of the camera mounted in the portable terminal so as to perform light bleeding inspection of the camera.

The controller may control turning-on of the plurality of LED elements of the light source device, may extract image data acquired by photographing the plurality of LED elements by the camera, when the light source device radiates light, and may analyze turning-on states of the plurality of LED elements based on the image data, so as to determine whether or not the camera is normal or defective in the light bleeding inspection.

The controller may sequentially turn on the plurality of LED elements per predetermined time, and may analyze videos of the plurality of LED elements, recorded by the camera, so as to determine whether or not the camera is normal or defective in video recording performance inspection.

The portable terminal cradle may include mounting jigs configured such that the portable terminal is mounted in an area defined thereby, and a mounting base configured such that the mounting jigs are detachably coupled thereto.

Advantageous Effects

A light source device according to one embodiment minimizes exposure of an LED package using an LED package cover, thereby being capable of preventing the LED package from being damaged or contaminated.

A camera inspection device according to another embodiment does not expose parts of a light source device other than LED elements, thereby being capable of preventing erroneous detection.

BEST MODE

Figure 1:
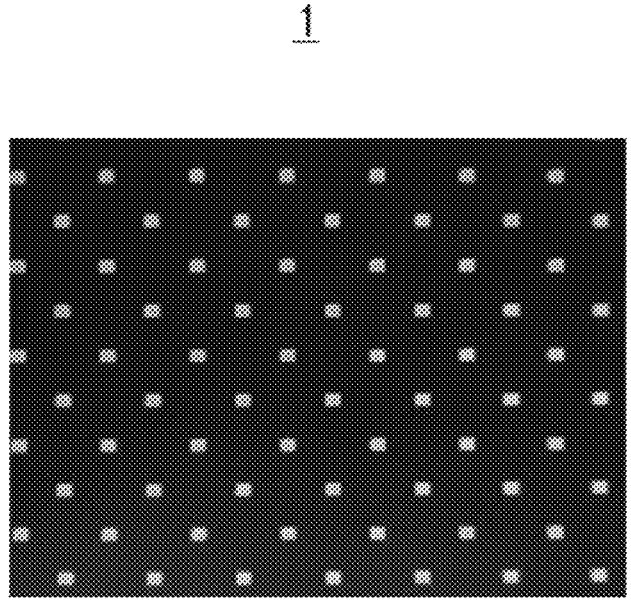
FIG. 1 is an exemplary view of a light source device used in a general camera inspection device.
Figure 2A:
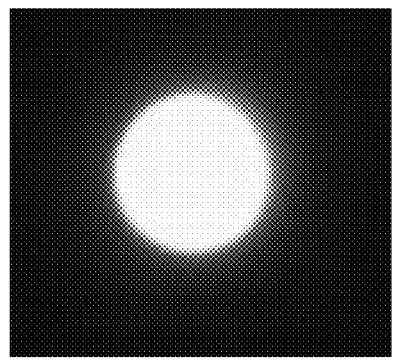
FIGS. 2A to 2C are exemplary views showing a light source type and the shape thereof during inspection.
Figure 2B:
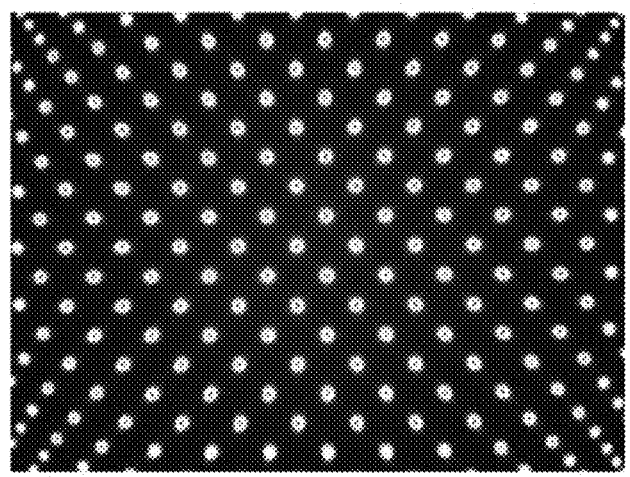
Figure 2C:
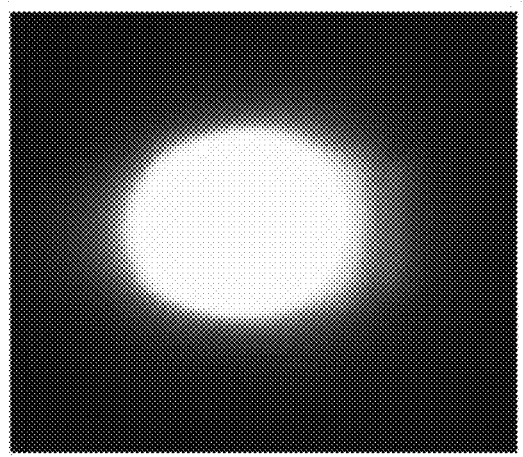

Specific structural or functional descriptions in embodiments set forth in the description which follows will be exemplarily given to describe the embodiments, and the embodiments are not limited to the aspects disclosed herein but may be implemented in various different forms.

The disclosure may be variously modified and be implemented in various forms, and thus, specific embodiments, examples of which are illustrated in the accompanying drawings, will be described in detail in the following description. However, the disclosure should not be interpreted as being limited to the embodiments set forth herein, and it will be understood that the disclosure covers modifications, equivalents or alternatives which come within the scope and technical range of the disclosure.

In the following description of the embodiments, terms, such as "first" and "second", are used only to describe various elements, and these elements should not be construed as being limited by these terms. These terms are used only to distinguish one element from other elements. For example, a first element described hereinafter may be termed a second element, and similarly, a second element described hereinafter may be termed a first element, without departing from the scope of the disclosure.

When an element or layer is referred to as being "connected to" or "coupled to" another element or layer, it may be directly connected or coupled to the other element or layer, or intervening elements or layers may be present. In contrast, when an element or layer is referred to as being "directly connected to" or "directly coupled to" another element or layer, there may be no intervening elements or layers present. Other words used to describe relationships between elements should be interpreted in a like fashion, e.g., "between" versus "directly between," "adjacent" versus "directly adjacent," etc.

The terminology used herein is for the purpose of describing particular embodiments only and is not intended to be limiting. As used herein, singular forms may be intended to include plural forms as well, unless the context clearly indicates otherwise. The terms "comprises," "comprising," "including," and "having" are inclusive and therefore specify the presence of stated features, integers, steps, operations, elements, components, and/or combinations thereof, but do not preclude the presence or addition of one or more other features, integers, steps, operations, elements, components, and/or combinations thereof.

Unless defined otherwise, all terms including technical or scientific terms used in the following description have the same meanings as those of terms generally understood by those skilled in the art. Terms defined in generally used dictionaries will be interpreted as having meanings coinciding with contextual meanings in the related technology, and are not to be interpreted as having ideal or excessively formal meanings unless defined clearly in the description.

The embodiments will be described in detail to fully convey the scope of the present disclosure to those skilled in the art, with reference to the accompanying drawings.

Figure 3:
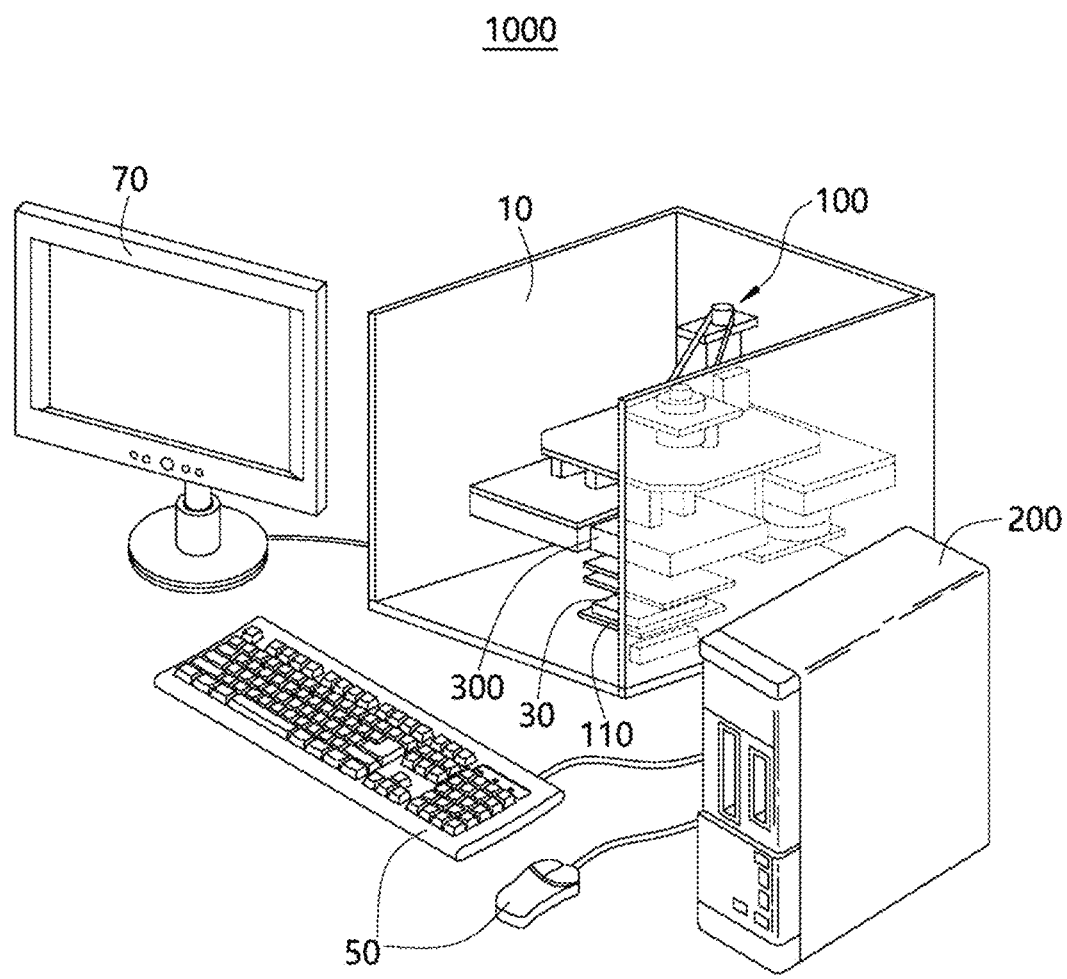
FIG. 3 is a perspective view schematically showing the configuration of an inspection system including a camera inspection device according to one embodiment.

FIG. 3 is a perspective view schematically showing a camera inspection device according to one embodiment. As shown in this figure, the camera inspection device 1000 according to one embodiment includes a camera inspection unit 100, a controller 200 configured to control turning-on of a light source device 300 and the imaging operation of a camera mounted in a portable terminal 30 so as to perform light bleeding inspection of the camera, an input unit 50 configured to receive various signals or commands for controlling the camera inspection unit 100 from a user and to transmit the received signals or commands to the controller 200, and a monitor 70 configured to display an image, photographed by the camera of the portable terminal held in a portable terminal cradle, on a screen.

The camera inspection unit 100 includes the portable terminal cradle 110 configured to hold the portable terminal 30 provided with the camera therein, and the light source device 300 installed to be spaced apart from the upper portion of the portable terminal cradle 110 by a predetermined distance, and configured to radiate light towards the camera.

The controller 200 controls turning-on of a plurality of LED elements of the light source device 300, extracts image data acquired by photographing the plurality of LED elements by the camera, when the light source device 300 radiates light, and analyzes the turning-on states of the plurality of LED elements based on the image data, thereby determining whether or not light bleeding of the camera occurs.

Figure 4A:
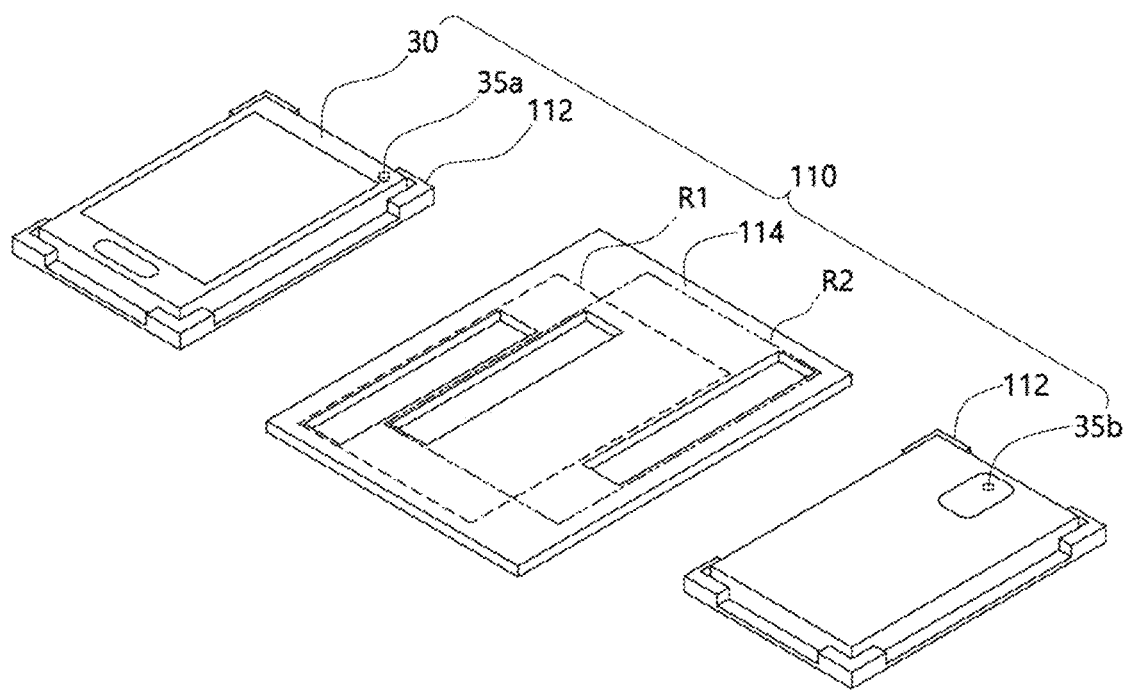
FIGS. 4A to 4C are perspective views schematically showing a portable terminal cradle of the camera inspection device according to one embodiment.
Figure 4B:
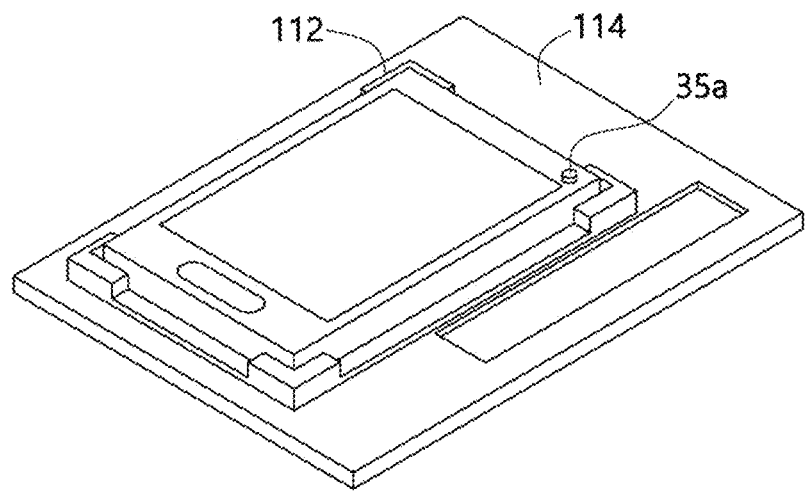
Figure 4C:
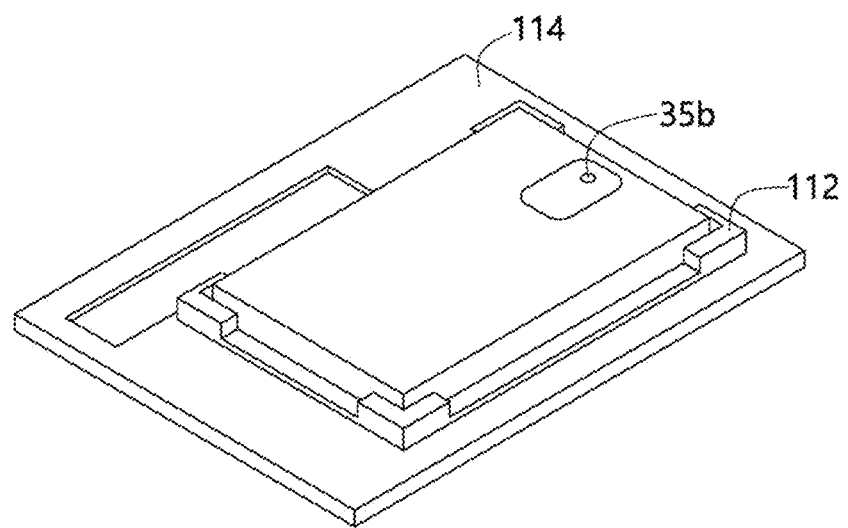

FIG. 4A is a perspective view schematically illustrating the portable terminal cradle of the camera inspection device according to one embodiment, FIG. 4B is a perspective view showing the mounted state of the portable terminal for inspection of a front camera using the camera inspection device according to one embodiment, and FIG. 4C is a perspective view showing the mounted state of the portable terminal for inspection of a rear camera using the camera inspection device according to one embodiment.

Referring to FIG. 4A, the portable terminal 30, in which cameras 35, i.e., objects to be inspected, are mounted, is held in the portable terminal cradle 110. The portable terminal cradle 110 may be fixedly installed on the inner surface of a case 10, and may include mounting jigs 112 configured such that the portable terminal 30 may be mounted in an area defined thereby, and a mounting base 114 coupled to the mounting jigs 112. The cameras 35 of the portable terminal 30 may include a front camera 35a and a rear camera 35b.

The mounting jigs 112 may be detachably provided on the mounting base 114. The mounting jigs 112 may be detachably provided in a first area R1 of the mounting base 114 so as to perform inspection of the front camera 35a of the portable terminal 30, as shown in FIG. 4B, and may be detachably provided in a second area R2 of the mounting base 114 so as to perform inspection of the rear camera 35b of the portable terminal 30, as shown in FIG. 4C.

Figure 5:
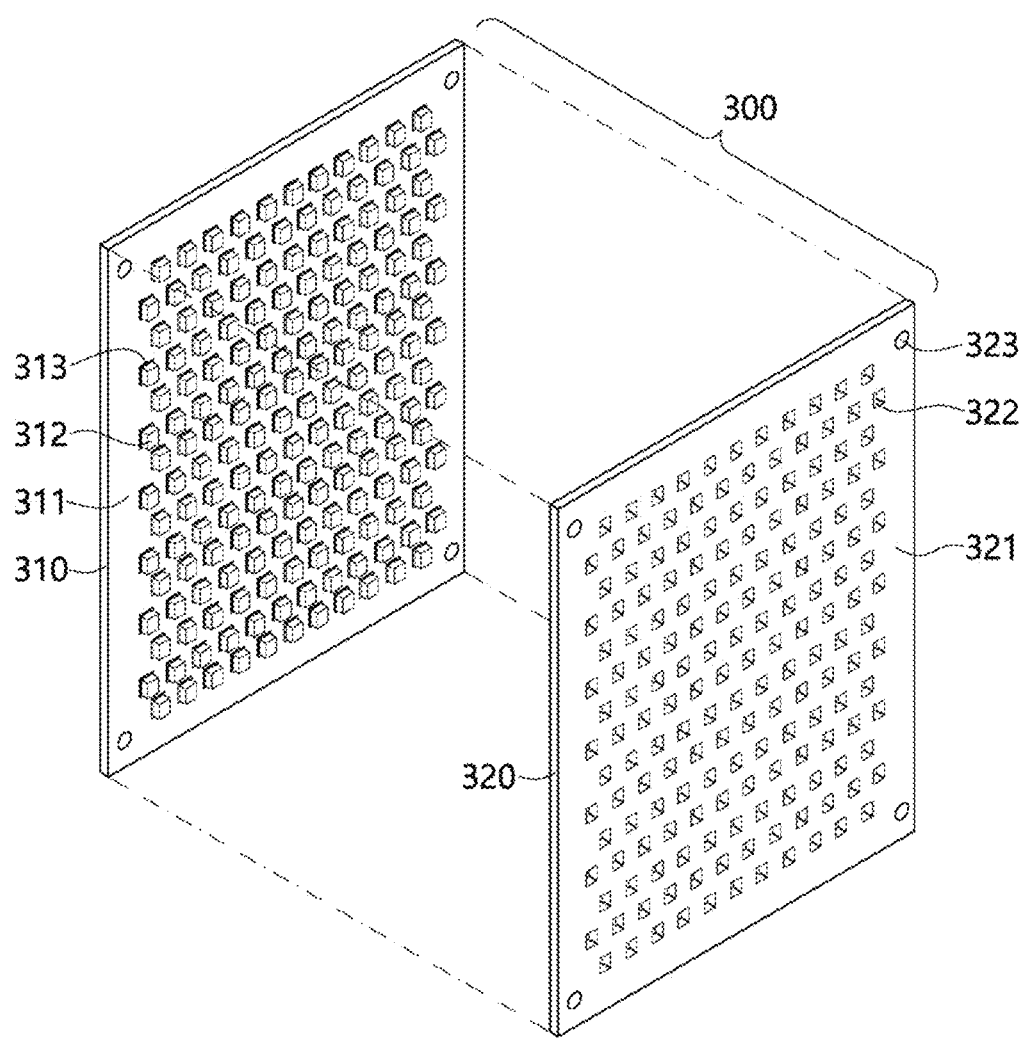
FIG. 5 is a perspective view showing the configuration of a light source device according to one embodiment.

FIG. 5 is a perspective view of the light source device according to one embodiment. As shown in this figure, the light source device 300 according to one embodiment includes an LED package 310 and an LED package cover 320.

The LED package 310 includes a printed circuit board 311, and a plurality of LED elements 312 mounted on the upper surface of the printed circuit board 311 by soldering parts 313. Here, the LED elements 312 are spaced apart from each other by a designated interval, and are mounted on the upper surface of the printed circuit board 311. The plurality of LED elements 312 may be mounted in zigzags on the upper surface of the printed circuit board 311. The plurality of LED elements 312 may emit the same color, or may emit different colors. The plurality of LED elements 312 may include white LED elements.

The LED package cover 320 includes a plurality of coupling holes 322 into which the plurality of LED elements 311 mounted on the printed circuit board 311 of the LED package 310 is respectively inserted. When the LED package 310 is coupled to the LED package cover 320 in a fitting manner by inserting the plurality of LED elements 311 into the plurality of coupling holes 322, the LED package cover 320 includes a part which covers exposed parts of the upper surface of the printed circuit board between the plurality of LED elements 311, for example, the soldering parts configured to bond the LED elements to the printed circuit board.

The LED package cover 320 may be formed of a plastic-based material. The LED package cover 320 may be formed in a platy shape or a circular shape. The LED package cover 320 may be formed of an elastic material so that the plurality of LED elements 311 may be coupled to the plurality of coupling holes 322 in the fitting manner.

Figure 6A:
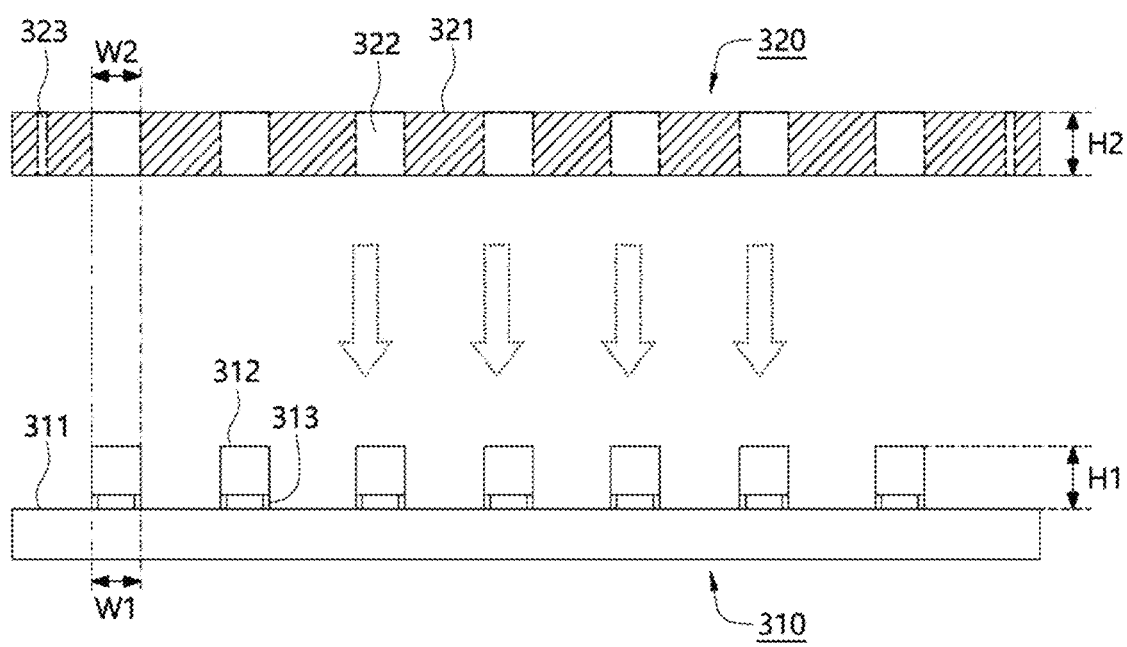
FIGS. 6A to 6C are exemplary views showing a process of coupling an LED package to an LED package cover of the light source device.
Figure 6B:
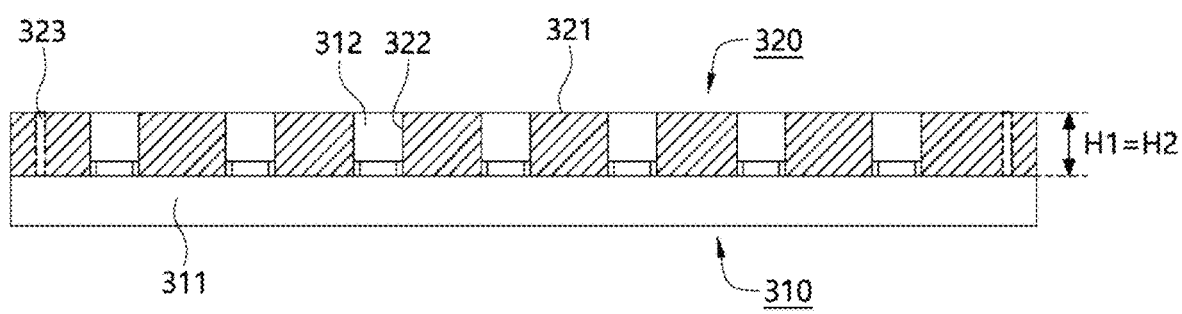
Figure 6C:
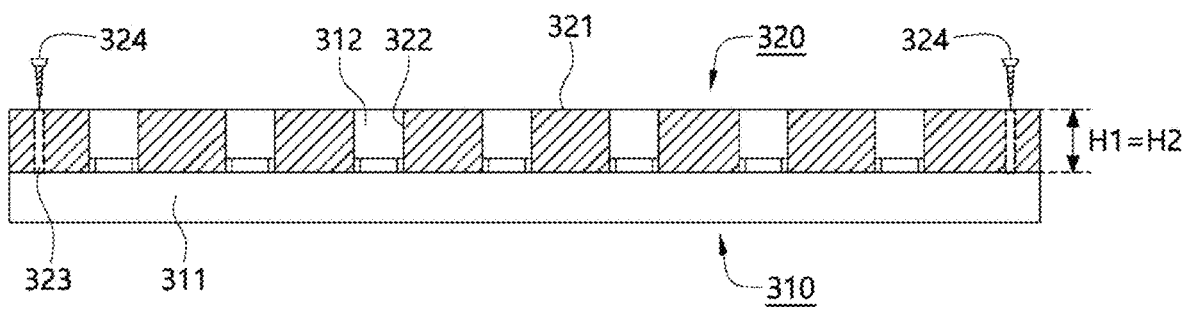

FIGS. 6A to 6C are exemplary views showing a process of coupling the LED package to the LED package cover of the light source device.

As shown in FIG. 6A, the LED package 310 is disposed, and the LED package cover 320 is disposed thereon. As shown in this figure, the height H1 of the LED elements 312 from the upper surface of the printed circuit board to the upper ends of the LED elements 312 is the same as the depth H2 of the coupling holes 322 formed in the LED package cover 320. Further, the width W2 of the coupling holes 322 is greater than the width W1 of the LED elements 312, and preferably, is almost the same as the width W1 of the LED elements 312 so that the LED elements 311 may be coupled to the coupling holes 322 in the fitting manner.

The LED package cover 320 includes a lower surface provided opposite to the upper surface of the printed circuit board 311, and an upper surface configured to be matte-finished and provided on the opposite side of the LED package cover 320 to the lower surface thereof.

FIG. 6B is an exemplary view showing that the LED package cover 320 is moved downwards and is coupled to the LED package 310. As shown in this figure, the LED package cover 320 is coupled to the LED package 310 by inserting the LED elements 312 into the coupling holes 322. Here, in order to increase coupling force between the LED package cover 320 and the LED package 310, the lower surface of the LED package cover 320 may be bonded to the upper surface of the printed circuit board.

As shown in FIG. 6C, the LED package cover 320 may include a plurality of screw coupling holes 323 formed at the respective corners of the LED package cover 320. A plurality of screws 324 is inserted into the plurality of screw coupling holes 323. The LED package cover 320 is screw-connected to the printed circuit board 311.

Figure 7:
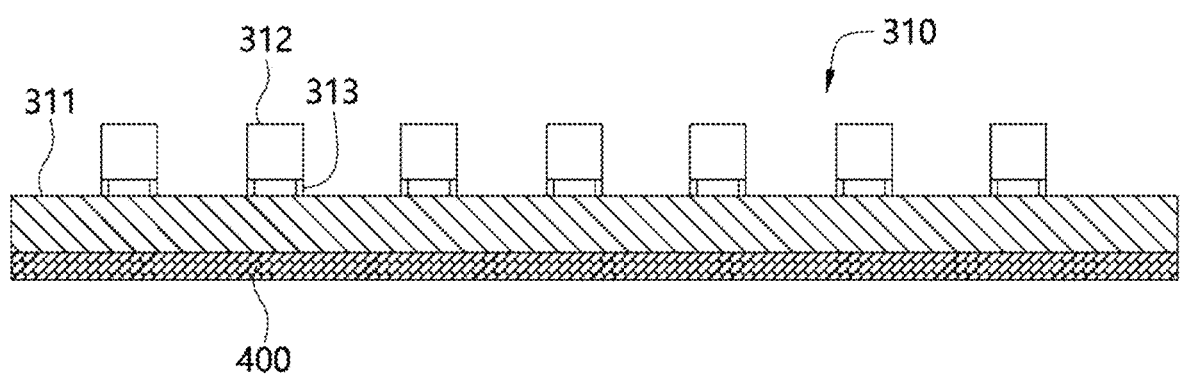
FIG. 7 is a perspective view showing the configuration of a light source device according to another embodiment.

FIG. 7 is a perspective view showing the configuration of a light source device according to another embodiment. As shown in this figure, a heat sink 400 configured to radiate heat generated by a printed circuit board 311 and LED elements 312 of an LED package 310 may be mounted. Here, the heat sink 400 may be formed of a metal having excellent thermal conductivity (for example, aluminum).

Figure 8:
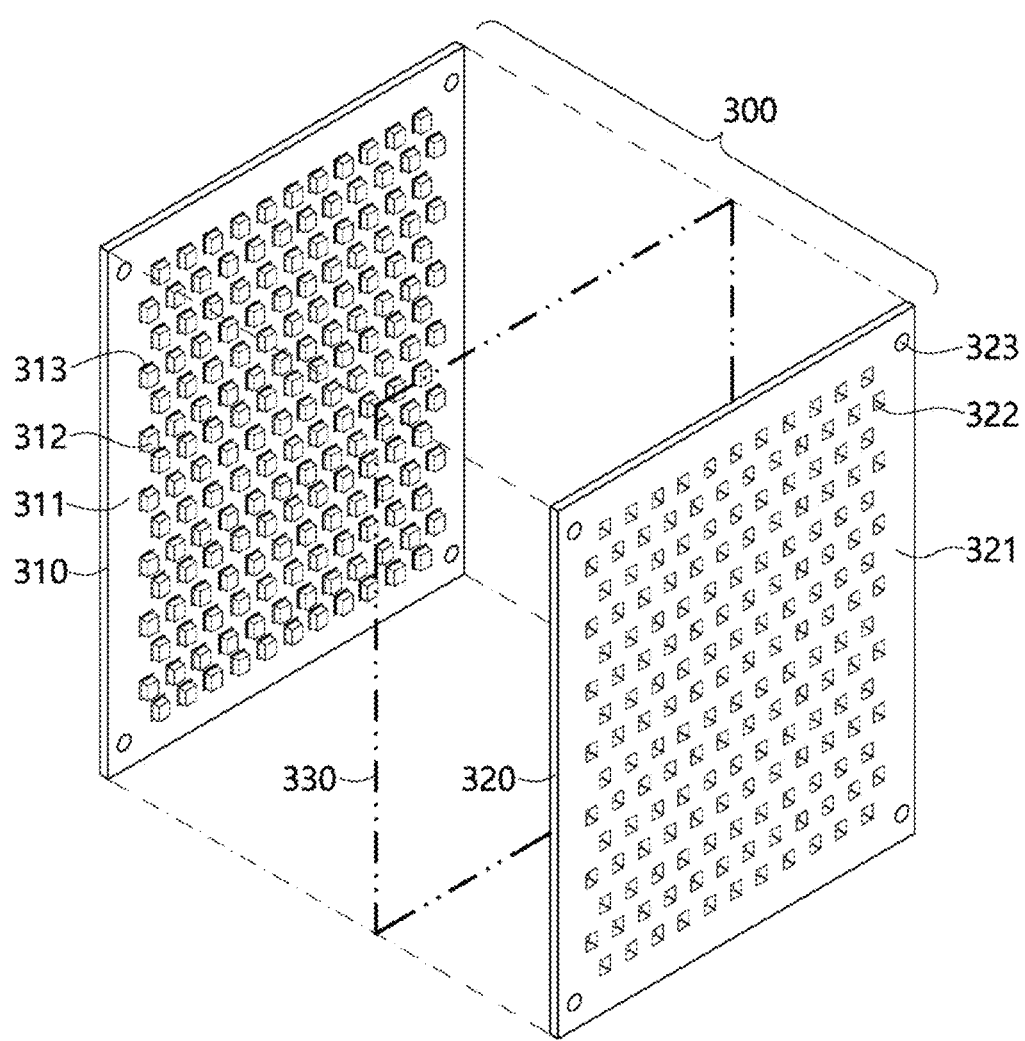
FIG. 8 is a perspective view showing the configuration of a light source device according to yet another embodiment.

FIG. 8 is a perspective view showing the configuration of a light source device according to yet another embodiment. As shown in this figure, the circumference of a bonding part between an LED package cover 320 and an LED package 310 may be sealed by an airtight packing 330. The airtight packing 330 is interposed between a printed circuit board 311 and the lower surface of the LED package cover 320 so as to be adhered thereto. The airtight packing 330 surrounds the circumference of the LED package 312 so as to completely cut off the LED package 312 from the outside. Thereby, the edge of the LED package 312 may be sealed so that inflow of foreign substances or moisture into a gap between the LED package 310 and the LED package cover 320 may be prevented.

Although this embodiment employs the airtight packing 330, the airtight packing 330 may be removed, and then, a sealant, such as silicone, may be adhered to the circumferences of the printed circuit board 311 of the LED package 310 and the LED package cover 320 so as to seal the gap between the LED package 310 and the LED package cover 320.

FIGS. 9A to 9F are exemplary views schematically showing the operation of the camera inspection device according to one embodiment in light bleeding and video inspections using the camera inspection device.

Figure 9A:
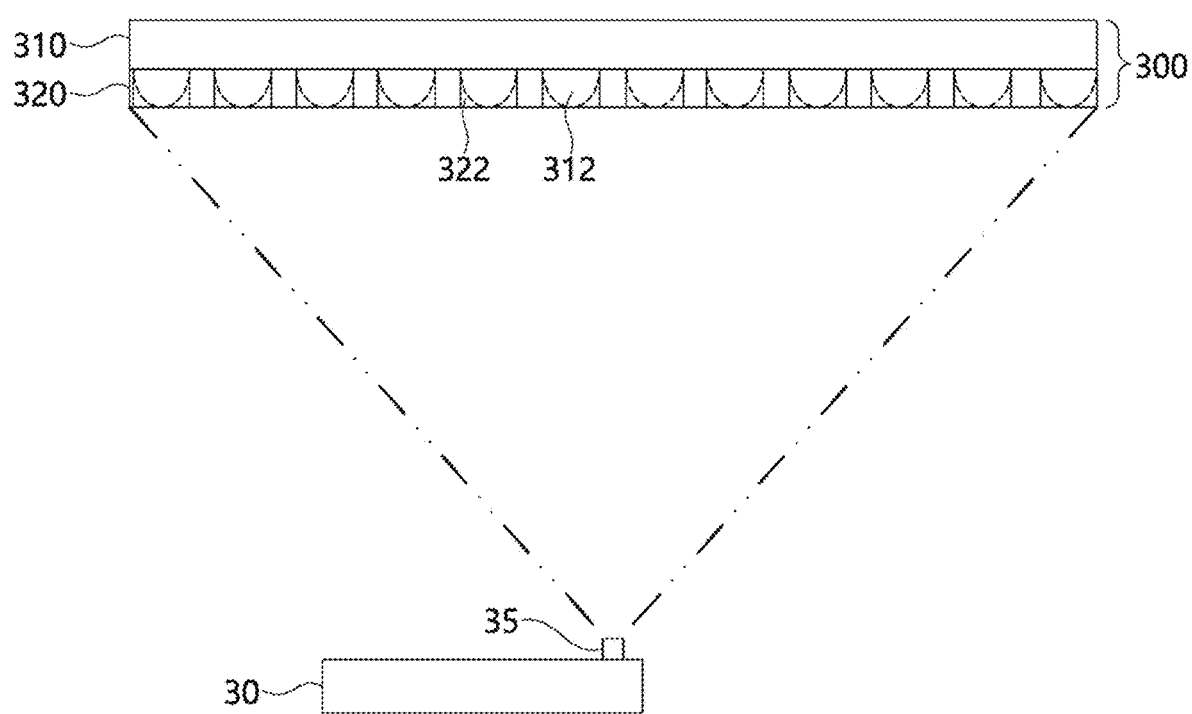
FIGS. 9A to 9F are exemplary views schematically showing the operation of the camera inspection device according to one embodiment in light bleeding and video inspections using the camera inspection device.

Referring to FIG. 9A, the light bleeding and video inspections are performed to inspect whether or not light bleeding occurs and whether or not a video recording function is properly operated, and it may be determined whether or not an imaging device, for example, the camera 35 mounted in the portable terminal, is defective in the light bleeding and video inspections by photographing the plurality of LED elements 312 provided in the LED package 310 of the light source device 300.

When the portable terminal 30 provided with the camera 35 mounted therein is located in the portable terminal cradle, the light source device 300 including the plurality of LED elements 312 mounted therein is located in the photographing area of the camera 35.

When all of the LED elements 312 of the light source device 300 are turned on, and then the camera 35 photographs the turned-on LED elements and transmits the image of the LED elements to the controller 200, the controller 200 may receive the image of the LED elements photographed by the camera 35, and may perform the light bleeding inspection.

Figure 9B:
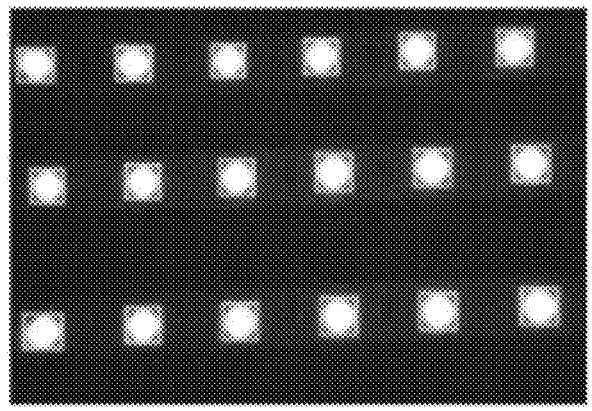
Figure 9C:
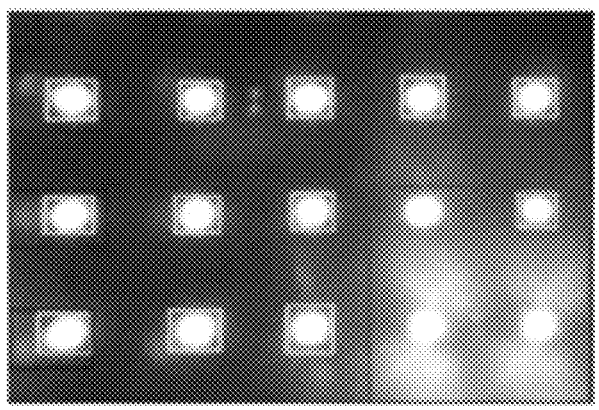

FIG. 9B is an exemplary view showing an image acquired by a camera determined as normal in the light bleeding inspection, and FIG. 9C is an exemplary view showing an image acquired by a camera determined as defective in the light bleeding inspection. In the image acquired by the camera determined as normal in the light bleeding inspection, all of the LED elements 312 in the turned-on state are clearly seen, as shown in FIG. 9B. However, in the image acquired by the camera determined as defective in the light bleeding inspection, some of the LED elements or all of the LED elements in the turned-on state look smudged, or look like they assume arbitrary shapes other than a square and are arranged irregularly, as shown in FIG. 9C, and therefore, it may be determined whether or not the camera 35 is normal or defective in the light bleeding inspection through image comparison.

Figure 9D:
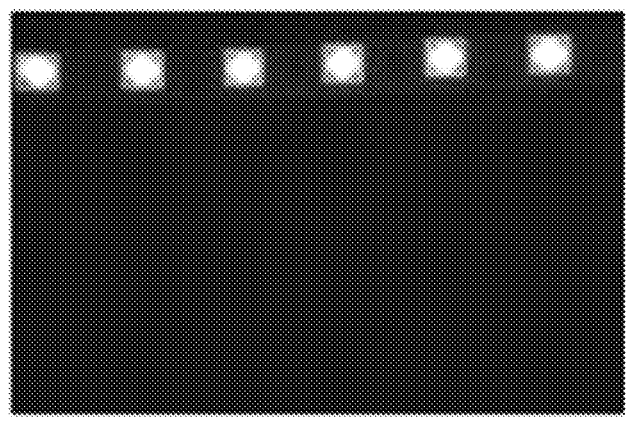
Figure 9E:
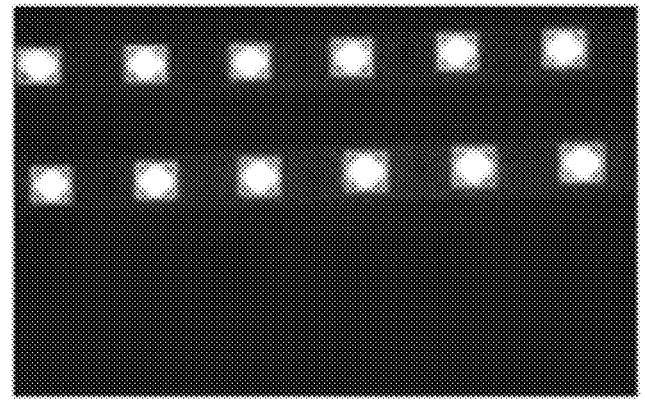
Figure 9F:
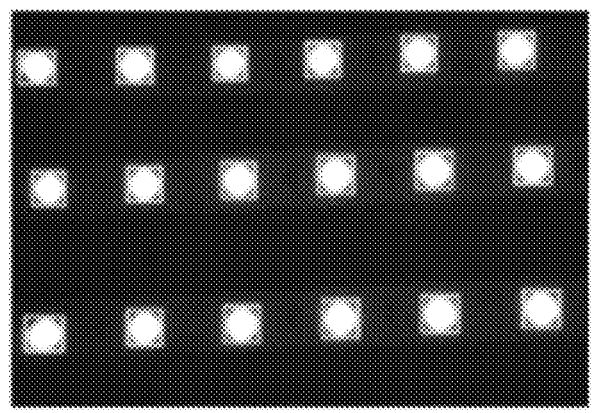

Further, FIGS. 9D to 9F are exemplary views sequentially showing video images, and the camera 35 may record videos of the plurality of LED elements, which are sequentially turned on, so as to perform the video inspection, as shown in FIGS. 9D to 9F.

In more detail, when the camera 35 records the videos of the plurality of LED elements, which are sequentially turned on every designated time, and transmits the videos to the controller 200, the controller 200 may extract a plurality of LED images having a designated time difference from the received videos. Thereafter, the controller 200 may determine whether or not the camera 35 is defective by analyzing the turned-on states of the LED elements depending on the time difference using software having an inspection function. For example, when the plurality of LED images extracted at the designated time difference by the controller 200 includes an image in which 6 LED elements are turned on, as shown in FIG. 9D, an image in which 12 LED elements are turned on, as shown in FIG. 9E, and an image in which 18 LED elements are turned on, as shown in FIG. 9F, the controller 200 may determine that the function of the camera 35 is good in the video inspection. Otherwise, the controller 200 may determine whether or not the camera 35 is defective in the video inspection through various other methods.

As is apparent from the above description, a light source device according to one embodiment allows LED elements mounted on an LED package to be inserted into coupling holes formed in a matte-finished LED package cover so as to be covered with the LED package cover, thereby being capable of preventing erroneous detection caused by exposure of elements, wires or soldering parts on the side surfaces of the LED elements in light bleeding inspection. Further, the LED package cover has the same height as that of the LED elements of the LED package, thereby preventing the LED elements from being damaged due to exposure to the outside.

Although embodiments have been described with reference to a number of illustrative embodiments thereof, it should be understood that numerous other modifications and embodiments can be devised by those skilled in the art that will fall within the spirit and scope of the principles of the disclosure.

[Description of Reference Numerals]

| | |
|---|---|
| 1, 300: light source device | 10: case |
| 30: portable terminal | 35: camera |
| 50: input unit | 70: monitor |
| 100: camera inspection unit | 110: portable terminal cradle |
| 112: mounting jig | 114: mounting base |
| 200: controller | 300: light source device |
| 310: LED package | 311: printed circuit board |
| 312: LED element | 313: soldering part |
| 320: LED package cover | 321: circuit cover part |
| 322: coupling hole | 324: screw |
| 330: airtight packing | 400: heat sink |

The invention claimed is:

1. A camera inspection device comprising:
  a portable terminal cradle configured such that a portable terminal provided with a camera is held therein;
  a light source device comprising:
    an LED package configured such that a plurality of LED elements is mounted on an upper surface of a printed circuit board, wherein the upper surface has a black background, and
    an LED package cover configured to cover exposed parts of the upper surface of the printed circuit board between the plurality of LED elements, and comprising a plurality of coupling holes configured such that the plurality of LED elements mounted on the LED package is respectively inserted thereinto,
    wherein the light source device is installed to be spaced apart from an upper portion of the portable terminal cradle by a predetermined distance and configured to radiate light towards the camera; and
  a controller configured to control turning-on of the light source device and an imaging operation of the camera mounted in the portable terminal so as to perform light bleeding inspection of the camera by analyzing a brightness difference between images of the LED elements and the background.

2. The camera inspection device according to claim 1, wherein a depth of the coupling holes is equal to a height of the LED elements from the upper surface of the printed circuit board to upper ends of the LED elements.

3. The camera inspection device according to claim 1, wherein the LED package cover is formed of a plastic-based material.

4. The camera inspection device according to claim 1, wherein:
the plurality of LED elements is coupled to the plurality of coupling holes in a fitting manner; and
the LED package cover is formed of an elastic material.

5. The camera inspection device according to claim 1, wherein the LED package cover further comprises:
a lower surface provided opposite to the upper surface of the printed circuit board; and
an upper surface configured to be matte-finished and provided on an opposite side of the LED package cover to the lower surface thereof.

6. The camera inspection device according to claim 5, wherein the lower surface of the LED package cover is bonded to the upper surface of the printed circuit board.

7. The camera inspection device according to claim 6, wherein:
the LED package cover further comprises a plurality of screw coupling holes; and
the LED package cover is screw-connected to the printed circuit board through the plurality of screw coupling holes.

8. The camera inspection device according to claim 7, wherein the plurality of screw coupling holes is formed at respective corners of the LED package cover.

9. The camera inspection device according to claim 1, wherein the LED package cover is formed in a platy shape or a circular shape.

10. The camera inspection device according to claim 1, wherein the LED package cover covers soldering parts configured to bond the plurality of LED elements to the upper surface of the printed circuit board.

11. The camera inspection device according to claim 1, further comprising a heat sink mounted on a lower surface of the printed circuit board of the LED package.

12. The camera inspection device according to claim 11, wherein the heat sink is formed of aluminum.

13. The camera inspection device according to claim 1, wherein a circumference of a bonding part between the LED package and the LED package cover is sealed with a sealant.

14. The camera inspection device according to claim 13, wherein the sealant is silicone.

15. The camera inspection device according to claim 1, wherein the portable terminal cradle comprises:
mounting jigs configured such that the portable terminal is mounted in an area defined thereby; and
a mounting base configured such that the mounting jigs are detachably coupled thereto.

16. The camera inspection device according to claim 1, wherein the controller:
controls turning-on of the plurality of LED elements of the light source device;
extracts image data acquired by photographing the plurality of LED elements by the camera, when the light source device radiates light; and
analyzes turning-on states of the plurality of LED elements based on the image data, so as to determine whether or not the camera is normal or defective in the light bleeding inspection.

17. The camera inspection device according to claim 1, wherein the controller:
sequentially turns on the plurality of LED elements per predetermined time; and
analyzes videos of the plurality of LED elements, recorded by the camera, so as to determine whether or not the camera is normal or defective in video recording performance inspection.

* * * * *